United States Patent
Lee et al.

(10) Patent No.: US 7,842,538 B2
(45) Date of Patent: Nov. 30, 2010

(54) ORGANIC THIN FILM TRANSISTOR ARRAY AND MANUFACTURING METHOD THEREOF

(75) Inventors: Yong-Uk Lee, Gyeonggi-do (KR); Bo-Sung Kim, Seoul (KR); Min-Seong Ryu, Gyeonggi-do (KR); Mun-Pyo Hong, Gyeonggi-do (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 12/015,297

(22) Filed: Jan. 16, 2008

(65) Prior Publication Data

US 2008/0131986 A1    Jun. 5, 2008

Related U.S. Application Data

(63) Continuation of application No. 11/186,744, filed on Jul. 20, 2005, now Pat. No. 7,342,247.

(30) Foreign Application Priority Data

Oct. 15, 2004   (KR) ...................... 10-2004-0082618

(51) Int. Cl.
*H01L 51/40* (2006.01)
(52) U.S. Cl. .......... 438/99; 257/E21.002; 257/E21.411; 438/479
(58) Field of Classification Search ............... 438/99, 438/608, 610, 479; 257/E21.025, E21.411, 257/E21.645, E21.535, E21.002
See application file for complete search history.

(56) References Cited

U.S. PATENT DOCUMENTS

| | | | |
|---|---|---|---|
| 6,326,640 B1 | 12/2001 | Shi et al. | |
| 6,373,453 B1 | 4/2002 | Yudasaka | |
| 6,746,905 B1 | 6/2004 | Fukuda | |
| 2002/0012080 A1 | 1/2002 | Ishihara et al. | |
| 2002/0179901 A1 | 12/2002 | Arai et al. | |

(Continued)

FOREIGN PATENT DOCUMENTS

CN          1398359          2/2003

(Continued)

OTHER PUBLICATIONS

English Abstract for Publication No. 11-065487.

(Continued)

*Primary Examiner*—Caridad M Everhart
(74) *Attorney, Agent, or Firm*—F. Chau & Associates, LLC

(57) ABSTRACT

An organic thin film transistor array panel is provided, which includes: a substrate; a data line formed on the substrate and including a source electrode; a drain electrode formed on the substrate and separated from the data line; an organic semiconductor disposed on the source electrode and the drain electrode; a gate insulator formed on the organic semiconductor; a gate line including a gate electrode disposed on the gate insulator; a passivation layer formed on the gate line and having a first contact hole on the drain electrode; a pixel electrode connected to the drain electrode through the first contact hole; and an opaque light blocking member disposed under the organic semiconductor.

14 Claims, 18 Drawing Sheets

U.S. PATENT DOCUMENTS

| | | | |
|---|---|---|---|
| 2004/0029310 A1* | 2/2004 | Bernds et al. | 438/99 |
| 2004/0041146 A1 | 3/2004 | Cheng et al. | |
| 2005/0186403 A1* | 8/2005 | Seki et al. | 428/195.1 |

FOREIGN PATENT DOCUMENTS

| | | |
|---|---|---|
| JP | 11-065487 | 3/1999 |
| JP | 2000-267073 | 9/2000 |
| JP | 2003-318190 | 7/2003 |
| JP | 2003-309265 | 10/2003 |
| JP | 2003-309268 | 10/2003 |
| JP | 2004-127897 | 4/2004 |
| KR | 100268308 | 7/2000 |
| KR | 1020000066502 | 11/2000 |
| KR | 1020020083401 | 11/2002 |
| KR | 100397671 | 8/2003 |
| KR | 100399283 | 9/2003 |

OTHER PUBLICATIONS

English Abstract for Publication No. 100268308.
English Abstract for Publication No. 2000-267073.
English Abstract for Publication No. 1020000066502.
English Abstract for Publication No. 1020020083401.
English Abstract for Publication No. 100397671.
English Abstract for Publication No. 100399283.
English Abstract for Publication No. 2003-309268.
English Abstract for Publication No. 2003-309265.
English Abstract for Publication No. 2003-318190.
English Abstract for Publication No. 2004-127897.
English Abstract for Publication No.: CN1398359.

* cited by examiner 120　110 even though they have a merit for the mass production due to their solution processability, such as coating and inkjet printing process.
ORGANIC THIN FILM TRANSISTOR ARRAY AND MANUFACTURING METHOD THEREOF

CROSS REFERENCE TO PRIOR APPLICATION

This application is a Continuation Application from a U.S. patent application Ser. No. 11/186,744 filed Jul. 20, 2005, now U.S. Pat. No. 7,342,247,which is herein specifically incorporated by reference in its entirety.

BACKGROUND OF THE INVENTION (a) Field of the Invention

The present invention relates to an organic thin film transistor array panel and a manufacturing method thereof.

(b) Description of Related Art

An electric field effect transistor using an organic semiconductor has been studied as a driving device for the next generation display.

Organic semiconductor materials may be classified into low molecule compounds and high molecule compounds. The low molecule compounds include oligothiophene, pentacene, phthalocyanine and $C_6O$. The high molecule compounds include polythiophene and polythienylenevinylene.

In general, the organic thin film transistors based on the low molecular weight organic semiconductor materials show a high mobility in a range of about 0.05-1.5 $cm^2/Vs$ and superior on/off current ratio. The formation process of the low molecular weight semiconductors layer, however, is a little bit complicated since the vacuum deposition processes are used. And as a consequence, the low molecular weight semiconductors have a demerit for mass production.

On the contrary, the organic thin film transistors based on the high molecular weight semiconductor materials show rather a low mobility in a range of about 0.001-0.1 $cm^2/Vs$ even though they have a merit for the mass production due to their solution processability, such as coating and inkjet printing process.

Recently, some organic semiconductor materials show good processibility or solution processability as well as good TFT characteristics such as high mobility and on-off current ratio. And some semiconducting materials with good processibility and good electrical characteristics are developed for the top gate structure even though many are developed for the bottom gate structure.

Organic thin film transistor shows photoleakage current when it is exposed to the light so the organic thin film transistor with a top gate structure cannot be applied to LCD display even though it has good properties because a backlight unit is used in LCD.

SUMMARY OF THE INVENTION

An organic thin film transistor array panel is provided, which includes: a substrate; a data line formed on the substrate and including a source electrode; a drain electrode formed on the substrate and separated from the data line; an organic semiconductor disposed on the source electrode and the drain electrode; a gate insulator formed on the organic semiconductor; a gate line including a gate electrode disposed on the gate insulator; a passivation layer formed on the gate line and having a first contact hole on the drain electrode; and a pixel electrode connected to the drain electrode through the first contact hole. The organic thin film transistor array panel further includes an opaque light blocking member disposed under the organic semiconductor.

The organic thin film transistor array panel may further include a bank having an opening that confines the organic semiconductor. The bank may have a second contact hole exposing the drain electrode together with the first contact hole. The gate insulator may be confined in the opening.

In one embodiment, the opaque light blocking member is formed on the substrate in alignment with the organic semiconductor.

The organic thin film transistor array panel may further include an insulating layer disposed between the organic semiconductor and the light blocking member.

The gate insulator may include at least one selected from the group consisting of silicon dioxide, silicon nitride, maleimide-styrene, polyvinylphenol (PVP), and modified cyanoethyl pullulan (m-CEP).

The gate insulator may include an organic material.

The organic semiconductor may include at least one selected from the group consisting of: tetracene, pentacene, and derivatives thereof with substituent; oligothiophene including four to eight thiophenes connected at the positions 2, 5 of thiophene rings; perylenetetracarboxylic dianhydride (PTCDA), naphthalenetetracarboxylic dianhydride (NTCDA), and imide derivatives thereof; metallized phthalocyanine and halogenated derivatives thereof; co-oligomer and co-polymer of thienylene and vinylene; regioregular polythiophene; perylene, coronene, and derivatives thereof with substituent; and aromatic and heteroaromatic ring of the above-described materials with at least one hydrocarbon chain having one to thirty carbon atoms.

The gate electrode may substantially fully cover the gate insulator.

The organic thin film transistor array panel may further include: an insulating layer formed under the data line and the drain electrode; a color filter formed under the insulating layer; and the light blocking member being formed under the color filter and in alignment with the organic semiconductor.

The thin film transistor array panel may further include a color filter formed under the passivation layer.

A method for manufacturing an organic thin film transistor array panel is provided, which includes: forming a light blocking member on a substrate; and forming a first insulating layer on the light blocking member forming a data line including a source electrode and a drain electrode on the first insulating layer; forming a partition having an opening partly exposing the source electrode and the drain electrode and a contact hole exposing the drain electrode; forming an organic semiconductor in the opening, the organic semiconductor being in alignment with the light blocking member; forming a gate insulator on the organic semiconductor; forming a passivation layer on the gate line; and forming a pixel electrode on the passivation layer.

The formation of the organic semiconductor and the formation of the gate insulator may include inkjet printing.

The partition may include organic insulating material.

The method may further include: forming a second insulating layer on the first insulating layer, the first insulating layer being an organic insulating material and the second insulating layer being an inorganic insulating material.

The method further include: forming a color filter under the data line and the drain electrode or under the passivation layer.

BRIEF DESCRIPTION OF THE DRAWINGS

The present invention will become more apparent by describing embodiments thereof in detail with reference to the accompanying drawing in which.

DETAILED DESCRIPTION OF EMBODIMENTS

Figure 1:
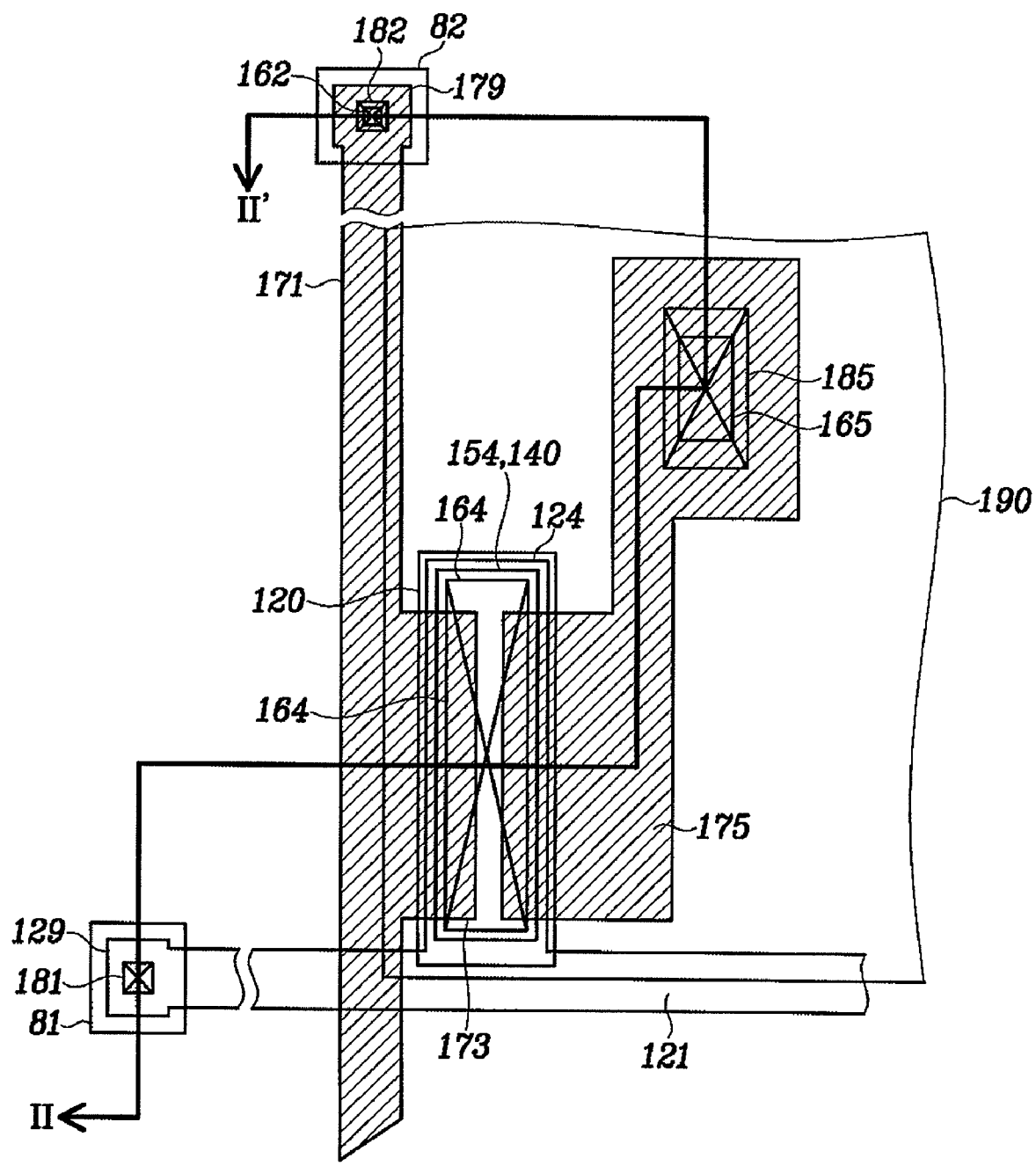
FIG. 1 is a layout view of an organic TFT array panel according to an embodiment of the present invention.

The present invention will now be described more fully hereinafter with reference to the accompanying drawings, in which preferred embodiments of the invention are shown. This invention may, however, be embodied in many different forms and should not be construed as limited to the embodiments set forth herein.

In the drawings, the thickness of layers and regions are exaggerated for clarity. Like numerals refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present.

An organic TFT array panel according to an embodiment of the present invention will be described in detail with reference to FIG. 1 and FIG. 2.

Figure 2:
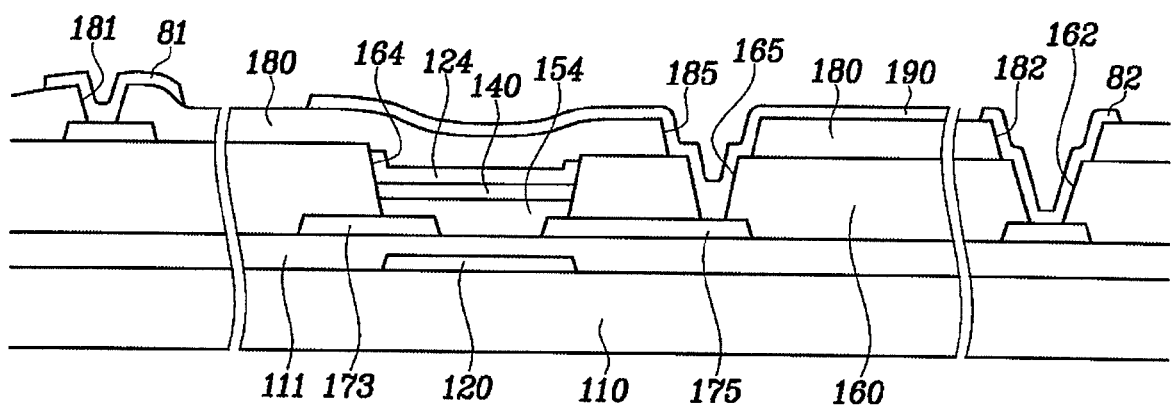
FIG. 2 is a sectional view of the organic TFT array panel shown in FIG. 1 taken along line II-II'.

FIG. 1 is a layout view of an organic TFT array panel according to an embodiment of the present invention, and FIG. 2 is a sectional view of the organic TFT array panel shown in FIG. 1 taken along line II-II'.

A plurality of light blocking islands 120 are formed on a substrate 110 such as transparent glass, silicon, or plastic. The light blocking islands 120 are preferably made of an opaque material such as Cr, Mo, or alloys thereof such that the light blocking islands 120 block the light emitted from a backlight unit (not shown) disposed under the substrate 110 or at the side of the substrate 110. The light blocking islands 120 may have a multilayered structure.

An insulating layer 111 is formed on the light blocking islands 120 and the substrate 110. Preferably, the insulating layer 111 has a flat surface for compensating the height difference caused by the light blocking islands 120, and the insulating layer 111 has low permittivity for reducing parasitic capacitance between the light blocking islands 120 and other conductors. In addition, it is preferable that the insulating layer 111 has a good contact characteristic with organic semiconductor, preserves the characteristics of the organic semiconductor, and has high light transmittance. The insulating layer 111 is preferably made of organic insulator such as acrylic organic compound or benzocyclobutene (BCB) or inorganic insulator such as silicon oxide or silicon nitride.

A plurality of data lines 171 and a plurality of drain electrodes 175 are formed on the insulating layer 111.

The data lines 171 transmit data signals and extend substantially in a longitudinal direction to intersect the gate lines 121. Each of the data lines 171 includes a plurality of source electrodes 173 projecting toward the gate electrodes 124 and an end portion 179 having a large area for contact with another layer or an external driving circuit. A data driving circuit (not shown) for generating the data signals may be mounted on a flexible printed circuit (FPC) film, which may be attached to the substrate 110, directly mounted on the substrate 110, or integrated onto the substrate 110. The data lines 171 may extend to be connected to a driving circuit that may be integrated on the substrate 110.

The drain electrodes 175 are separated from the data lines 171 and disposed opposite the source electrodes 173 with respect to the gate electrodes 124.

The data lines 171 and the drain electrodes 175 are preferably made of Al containing metal such as Al and Al alloy, Ag containing metal such as Ag and Ag alloy, Au containing metal such as Au and Au alloy, Cu containing metal such as Cu and Cu alloy, Mo containing metal such as Mo and Mo alloy, Ni, Cr, Ti, Ta, or indium tin oxide (ITO). However, they may have a multi-layered structure including two conductive films (not shown) having different physical characteristics. One of the two films is preferably made of low resistivity metal for reducing signal delay or voltage drop and the other film is preferably made of material having good physical, chemical, and electrical contact characteristics with other materials such as organic semiconductor, ITO, or indium zinc oxide (IZO). However, the data lines 171 and the drain electrodes 175 may be made of various metals or conductors.

The data lines 171 and the drain electrodes 175 have inclined edge profiles, and the inclination angles thereof range about 30-80 degrees.

A partition 160 is formed on the insulating layer 111, the data lines 171, and the drain electrodes 175.

The partition 160 has a plurality of openings 164 and a plurality of contact holes 162 and 165. The openings 164 are disposed on the light blocking islands 120 and expose portions of the source electrodes 173, portions of the drain electrodes 175, and portions of the insulating layer 111 disposed between the source electrode 173 and the drain electrode 175. The contact holes 165 and 162 expose the drain electrodes 175 and the end portions 179 of the data lines 171, respectively, and they have inclined sidewalls.

The partition 160 is preferably made of an acrylic photo-sensitive organic insulating material and it may have a thickness in the range of about 2-5 microns.

The partition 160 can be omitted.

A plurality of organic semiconductor islands 154 are formed in the openings 164 of the partition 160. The organic semiconductor islands 154 contacts the source electrodes 173 and the drain electrodes 175 and they are fully covered by the light blocking islands 120.

The organic semiconductor islands 154 may include a high molecular compound or a low molecular compound, which is soluble in an aqueous solution or organic solvent, and in this case, the organic semiconductor islands 154 can be formed by (inkjet) printing. However, the organic semiconductor islands 154 may be formed by deposition including spin coating and by lithography with or without etch and in this case, the partition 160 can be omitted.

The organic semiconductor islands 154 may be made of, or from derivatives of, tetracene or pentacene with substituent. Alternatively, the organic semiconductor islands 154 may be made of oligothiophene including four to eight thiophenes connected at the positions 2, 5 of thiophene rings.

The organic semiconductor islands 154 may be made of perylenetetracarboxylic dianhydride (PTCDA), naphthalene-tetracarboxylic dianhydride (NTCDA), or their imide derivatives.

The organic semiconductor islands 154 may be made of metallized phthalocyanine or halogenated derivatives thereof. The metallized phthalocyanine may include Cu, Co, Zn, etc.

The organic semiconductor islands 154 may be made of co-oligomer or co-polymer of thienylene and vinylene. In addition, organic semiconductor islands 154 may be made of regioregular polythiophene.

The organic semiconductor islands 154 may be made of perylene, coronene or derivatives thereof with substituent.

The organic semiconductor islands 154 may be made of derivatives of aromatic or heteroaromatic ring of the above-described derivatives with at least one hydrocarbon chain having one to thirty carbon atoms.

An inorganic insulating layer (not shown), preferably made of silicon nitride, for preventing organic impurity in the organic insulating layer 111 from being intruded into the organic semiconductor islands 154 may be provided between the insulating layer 111 and the organic semiconductor islands 154.

A plurality of gate insulators 140 are formed on the organic semiconductor islands 154. The gate insulators 140 are confined in the openings 164 of the partition 160 and fully cover the organic semiconductor islands 154.

The gate insulators 140 may also include a high molecular compound or a low molecular compound, which is soluble in an aqueous solution or organic solvent and thus, the gate insulators 140 can be formed by (inkjet) printing. At this time, it is preferable that the gate insulators 140 has poor affinity with the organic semiconductor islands 154 so that one of the gate insulators 140 and the organic semiconductor islands 154 is insoluble in the solvent for the other of the gate insulators 140 and the organic semiconductor islands 154. The gate insulators 140 may be also formed by deposition including spin coating and by lithography with or without etch. In this case, the partition 160 can be omitted and the gate insulators 140 may be connected to each other.

The gate insulators 140 may be made of inorganic insulator or organic insulator. Examples of the inorganic insulator include silicon nitride (SiNx) and silicon dioxide ($SiO_2$) that may have a surface treated with octadecyl-trichloro-silane (OTS). Examples of the organic insulator include maleimide-styrene, polyvinylphenol (PVP), and modified cyanoethyl pullulan (m-CEP).

A plurality of gate lines 121 are formed on the gate insulators 140 and the partition 160.

The gate lines 121 transmit gate signals and extend substantially in a transverse direction to intersect the data lines 171. Each gate line 121 includes a plurality of gate electrodes 124 projecting upward and an end portion 129 having a large area for contact with another layer or an external driving circuit. The gate electrodes 124 fully cover the gate insulators 140 and the organic semiconductor islands 154.

A gate driving circuit (not shown) for generating the gate signals may be mounted on a FPC film, which may be attached to the substrate 110, directly mounted on the substrate 110, or integrated onto the substrate 110. The gate lines 121 may extend to be connected to a driving circuit that may be integrated on the substrate 110.

A gate electrode 124, a source electrode 173, and a drain electrode 175 along with an organic semiconductor island 154 form an organic TFT having a channel formed in the organic semiconductor island 154 disposed between the source electrode 173 and the drain electrode 175. Since the organic semiconductor islands 154 are fully covered by the gate electrodes 124 and the light blocking islands 120 and thus the organic semiconductor islands 154 are substantially completely shielded from external light, the leakage current of the TFT induced by the external light is prevented to secure the stable characteristics of the TFT.

The gate lines 121 are preferably made of Al containing metal such as Al and Al alloy, Ag containing metal such as Ag and Ag alloy, Au containing metal such as Au and Au alloy, Cu containing metal such as Cu and Cu alloy, Mo containing metal such as Mo and Mo alloy, Cr, Ti, or Ta. However, they may have a multi-layered structure including two conductive films (not shown) having different physical characteristics. One of the two films is preferably made of low resistivity metal for reducing signal delay or voltage drop and the other film is preferably made of material having good physical, chemical, and electrical contact characteristics with other materials such as ITO or IZO. However, the gate lines 121 may be made of various metals or conductors.

The lateral sides of the gate lines 121 are inclined relative to a surface of the substrate, and the inclination angle thereof ranges about 30-80 degrees.

A passivation layer 180 is formed on the gate lines 121 and the partition 160. The passivation layer 180 is preferably made of inorganic insulator such as silicon nitride or silicon oxide, organic insulator, or low dielectric insulator. The organic insulator and the low dielectric insulator preferably have dielectric constant less than about 4.0 and the low dielectric insulator includes a-Si:C:O and a-Si:O:F formed by plasma enhanced chemical vapor deposition (PECVD). The organic insulator for the passivation 180 may have photosensitivity and the passivation 180 may have a flat surface.

The passivation layer 180 has a plurality of contact holes 182 and 185 exposing the contact holes 162 and 165 of the partition 160, respectively, and a plurality of contact holes 181 exposing the end portions 129 of the gate lines 121.

A plurality of pixel electrodes 190 and a plurality of contact assistants 81 and 82 are formed on the passivation layer 180. They are preferably made of transparent conductor such as ITO or IZO or reflective conductor such as Ag or Al.

The pixel electrodes 190 are physically and electrically connected to the drain electrodes 175 through the contact holes 185 such that the pixel electrodes 190 receive data voltages from the drain electrodes 175. The pixel electrodes 190 supplied with the data voltages generate electric fields in cooperation with a common electrode (not shown) of an opposing display panel (not shown) supplied with a common voltage, which determine the orientations of liquid crystal molecules (not shown) of a liquid crystal layer (not shown) disposed between the two electrodes. A pixel electrode 190 and the common electrode form a capacitor referred to as a "liquid crystal capacitor," which stores applied voltages after the TFT turns off.

The pixel electrodes 190 overlap the gate lines 121 and the data lines 171 to increase aperture ratio.

The contact assistants 81 and 82 are connected to the end portions 129 of the gate lines 121 and the end portions 179 of the data lines 171 through the contact holes 181 and 182, respectively. The contact assistants 81 and 82 protect the end portions 129 and 179 and enhance the adhesion between the end portions 129 and 179 and external devices.

In the meantime, the above-described opposing panel facing the TFT array panel includes a light blocking member (not shown) referred to as a black matrix for blocking light leakage between the pixel electrodes 190 and a plurality of color filters (not shown) for implementing color representation, and the above-described common electrode.

The operation of the above-described organic TFT will be described in detail.

The charge carriers, i.e., holes or electrons in the organic semiconductor islands 154 are uniformly distributed when no voltage is applied to the gate electrode 124 and there is no voltage difference between the source electrode 173 and the drain electrode 175. Upon the application of a voltage between the source electrode 173 and the drain electrode 175, an electrical current is generated in the organic semiconductor island 154 and the amount of the current is in proportion to the applied voltage when the applied voltage is small. Upon the application of a voltage to the gate electrode 124 (referred to as "gate voltage" hereinafter), the charge carriers move in response to an electric field generated by the gate voltage. Depending on the polarity of the gate voltage, the charge carriers move away from or closer to the gate electrode 124 to form a depletion layer including no charge carrier or an accumulation layer full of charge carriers in the organic semiconductor island 154 near the gate insulator 140. Accordingly, the current flowing in the organic semiconductor island 154 can be controlled by controlling the magnitude and the polarity of the gate voltage.

A method for manufacturing the organic TFT array panel shown in FIG. 1 and FIG. 2 according to an embodiment of the present invention will be described with reference to FIG. 3 to FIG. 14.

Figure 3:
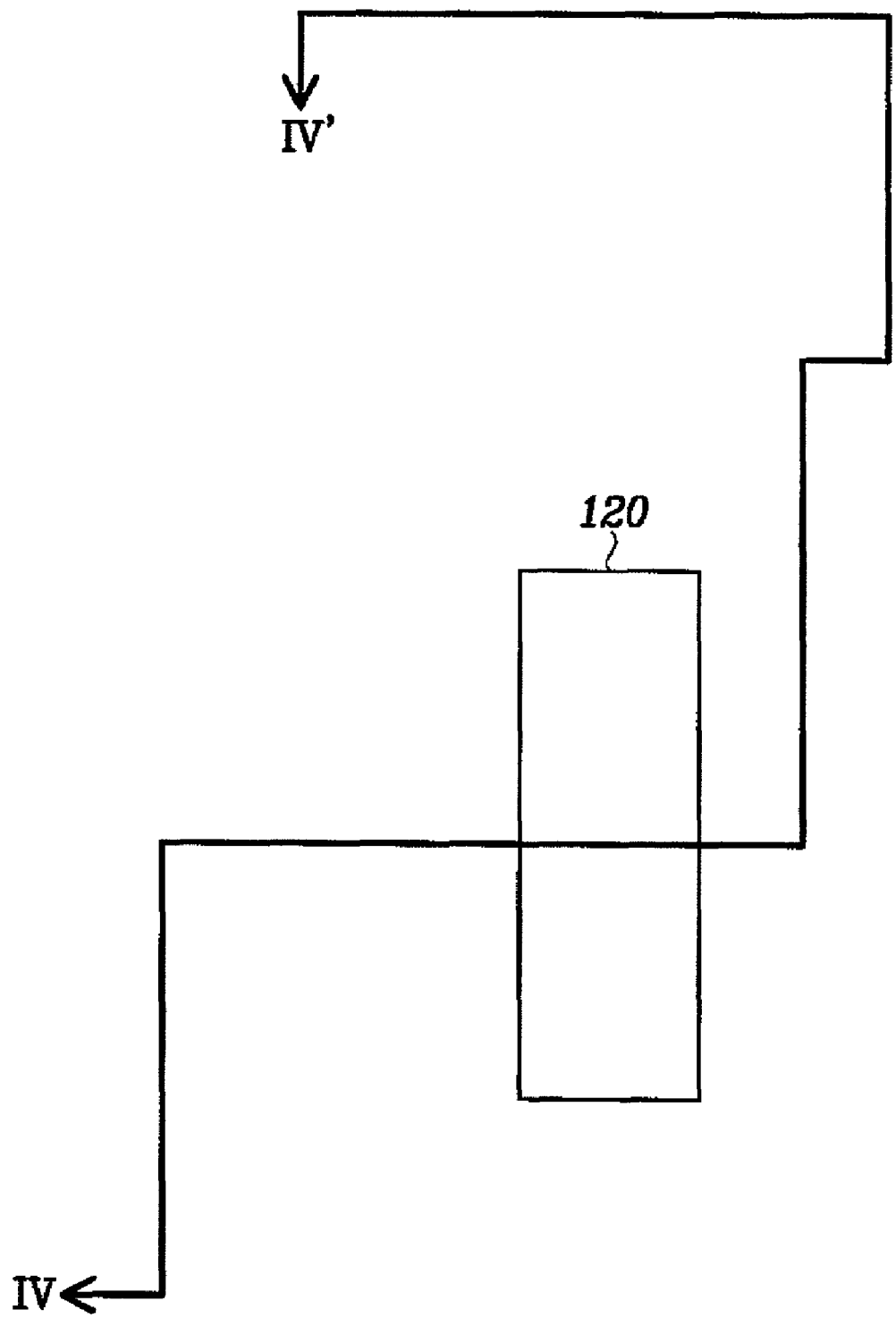
FIG. 3, FIG. 5, FIG. 7, FIG. 9, FIG. 11, and FIG. 13 are layout views of the organic TFT array panel shown FIG. 1 and FIG. 2 in intermediate steps of a manufacturing method thereof according to an embodiment of the present invention.
Figure 4:
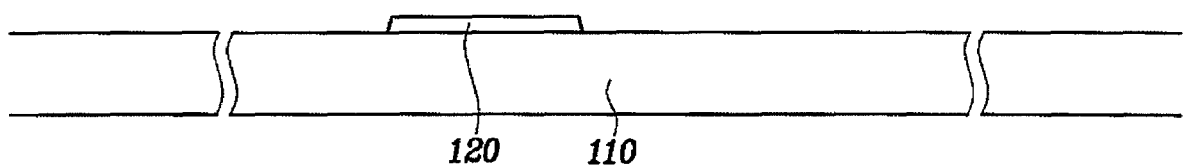
FIG. 4 is a sectional view of the TFT array panel shown in FIG. 3 taken along line IV-IV'.
Figure 5:
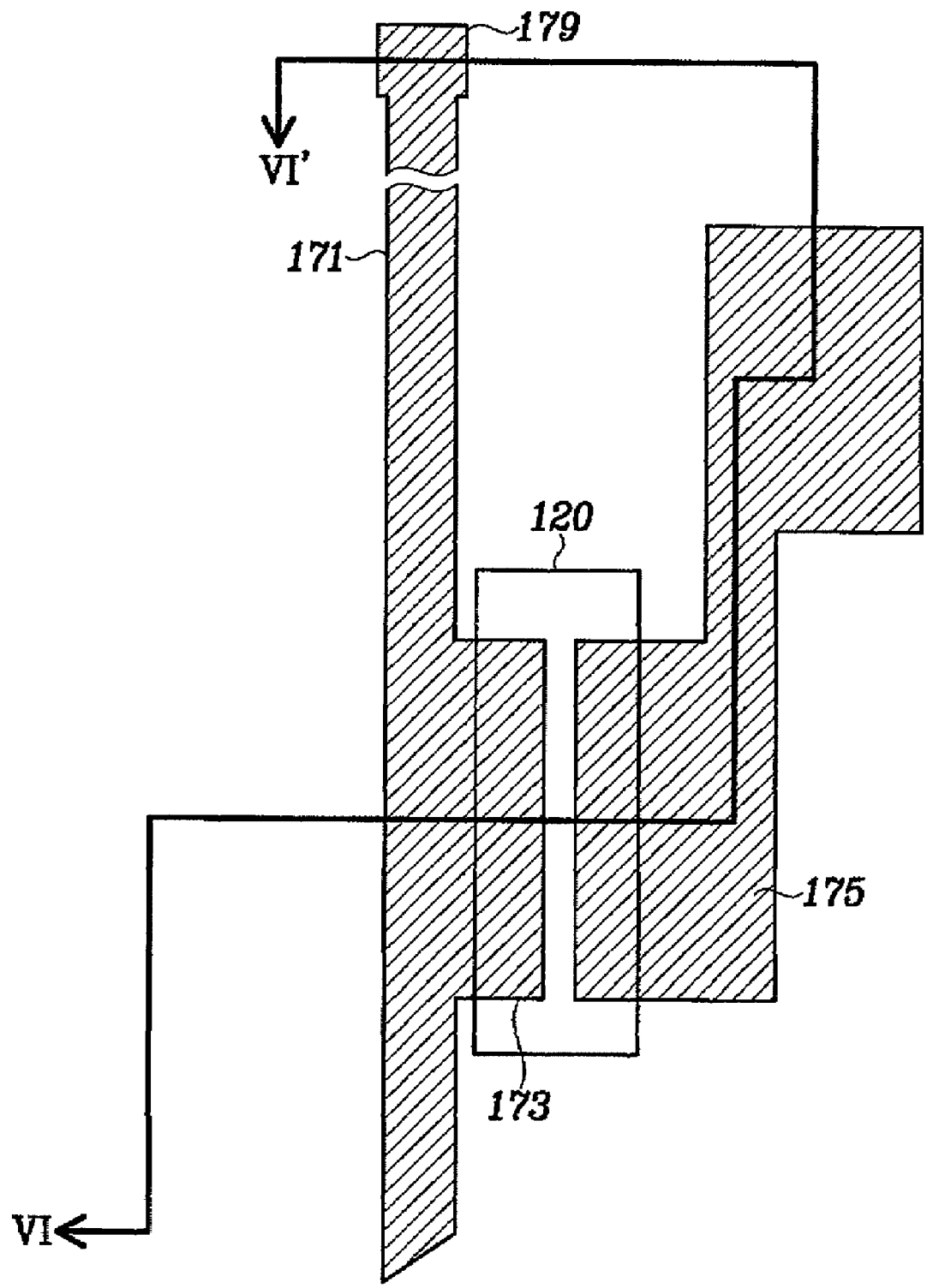
Figure 6:
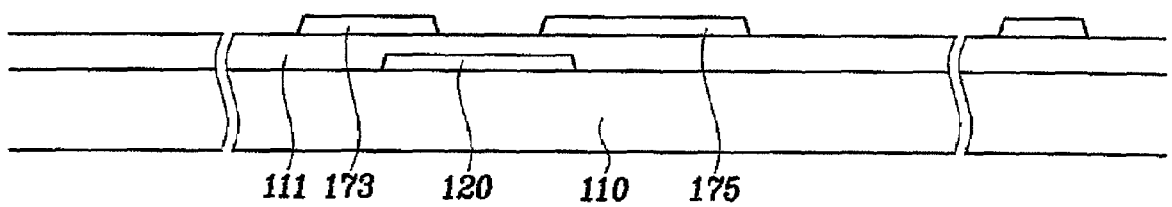
FIG. 6 is a sectional view of the TFT array panel shown in FIG. 5 taken along line VI-VI'.
Figure 7:
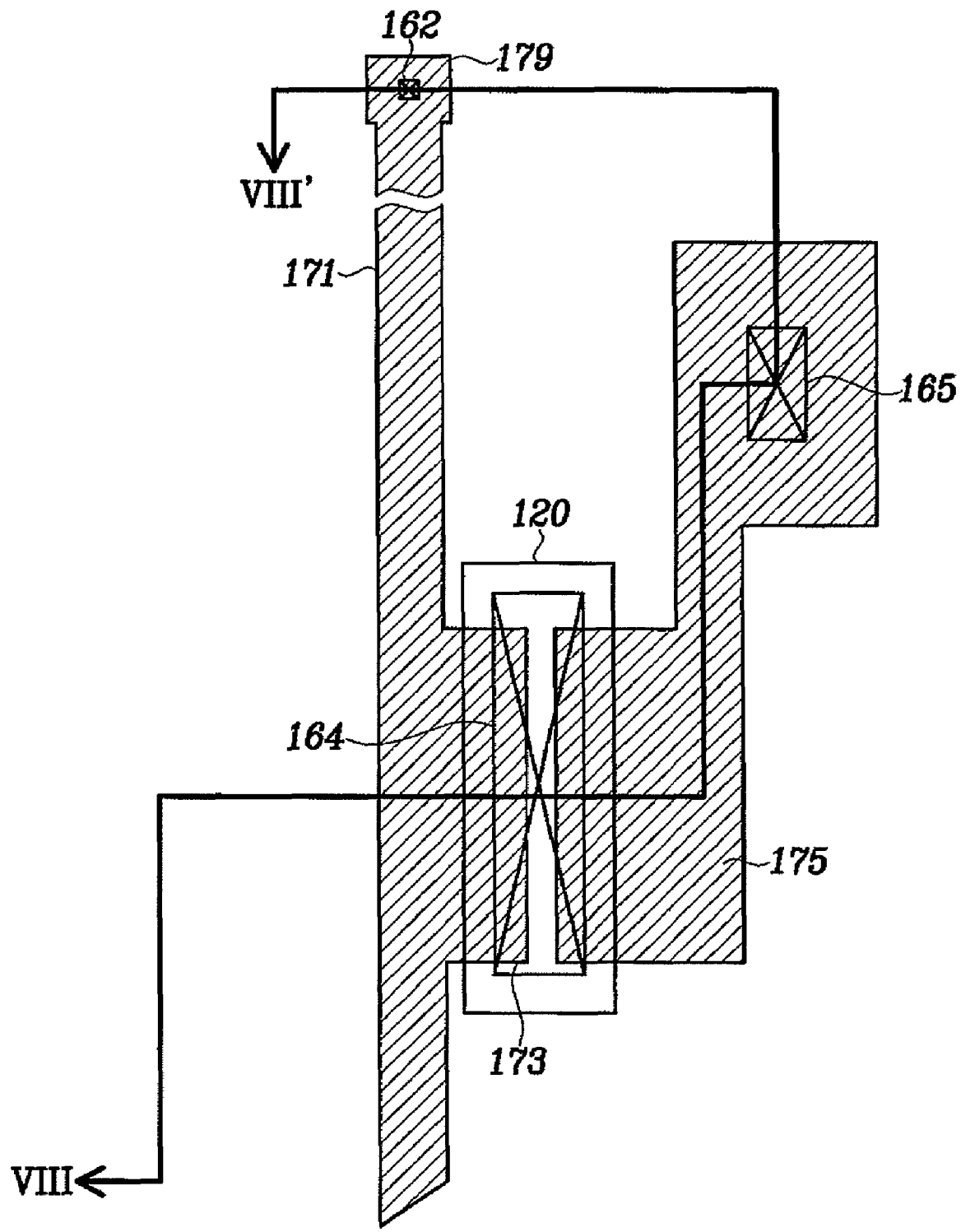
Figure 8:
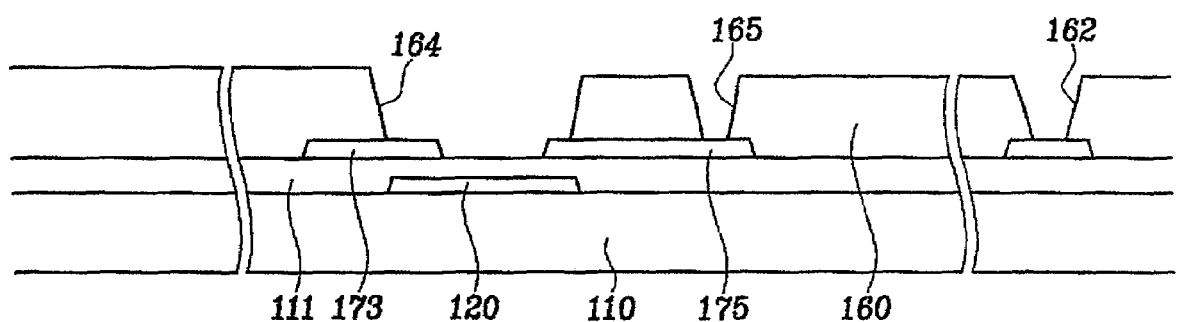
FIG. 8 is a sectional view of the TFT array panel shown in FIG. 7 taken along line VIII-VIII'.
Figure 9:
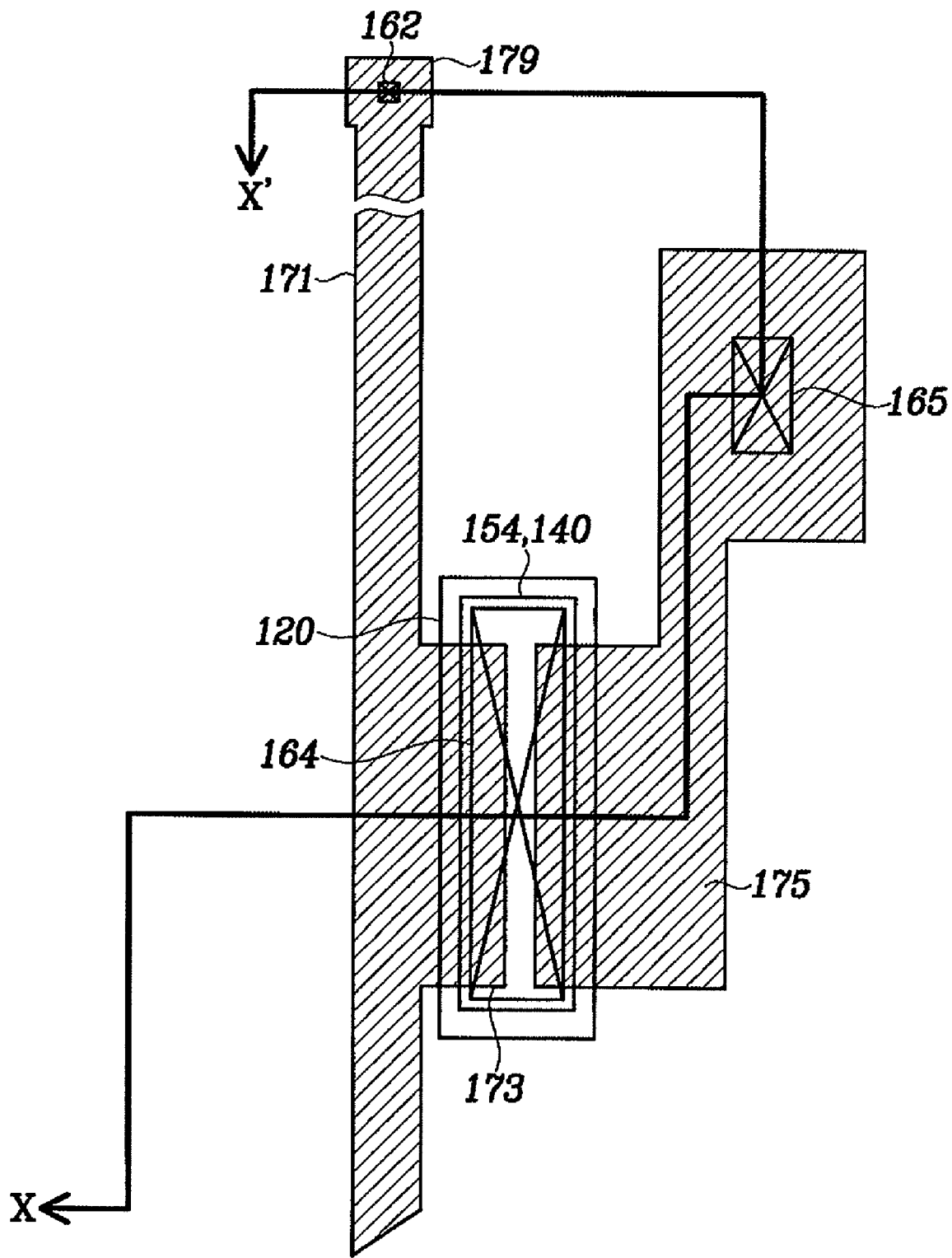
Figure 10:
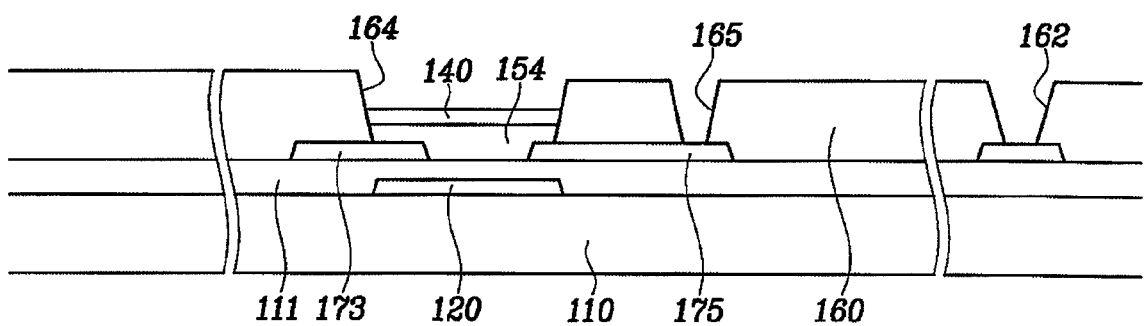
FIG. 10 is a sectional view of the TFT array panel shown in FIG. 9 taken along line X-X'.
Figure 11:
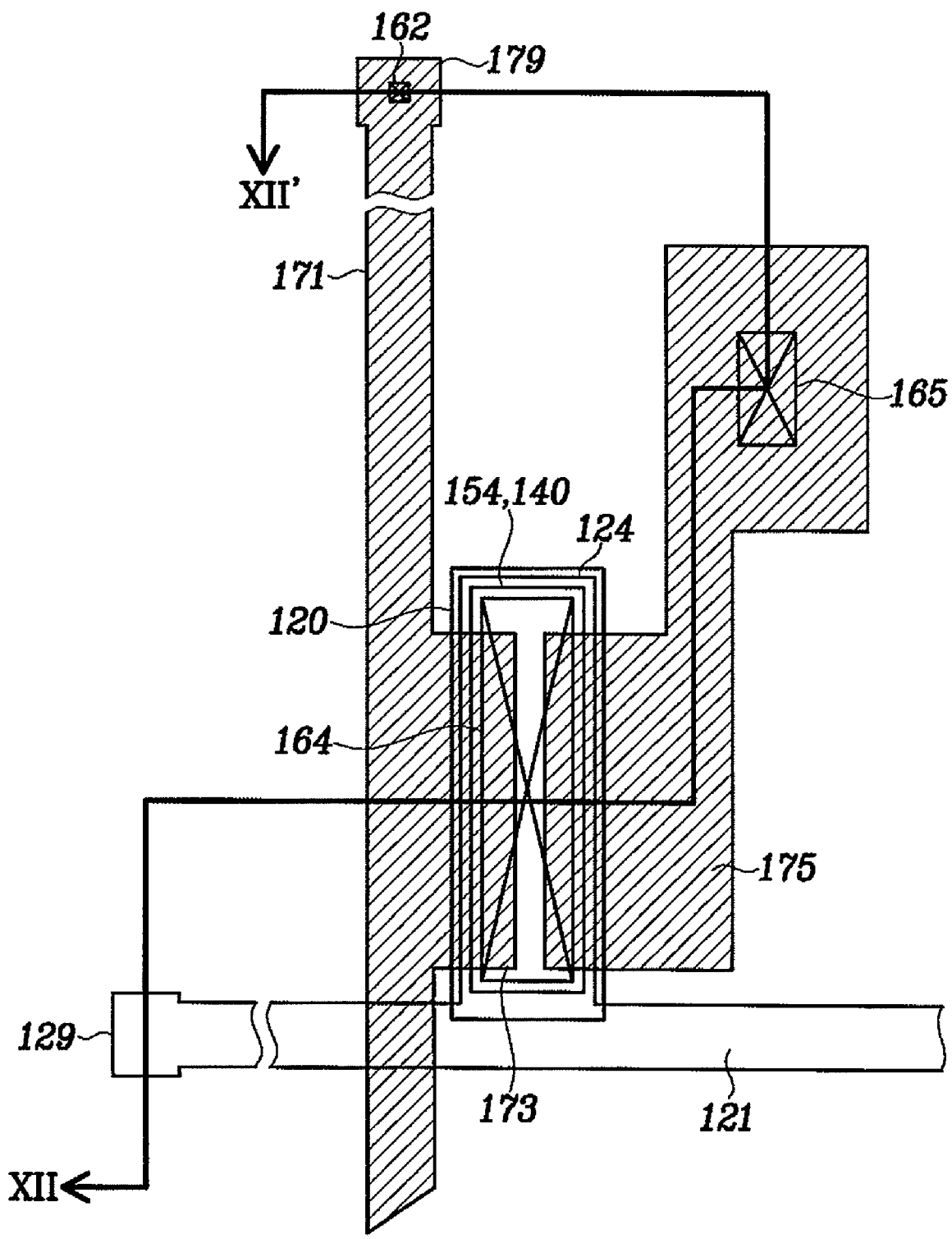
Figure 12:
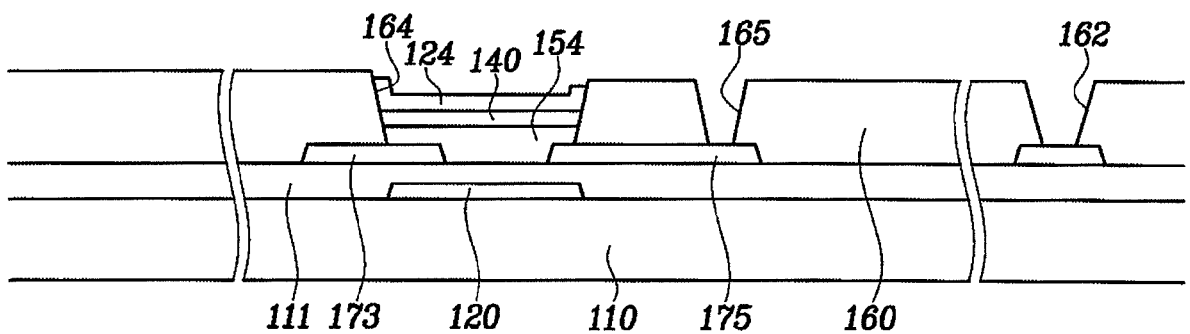
FIG. 12 is a sectional view of the TFT array panel shown in FIG. 11 taken along line XII-XII'.
Figure 13:
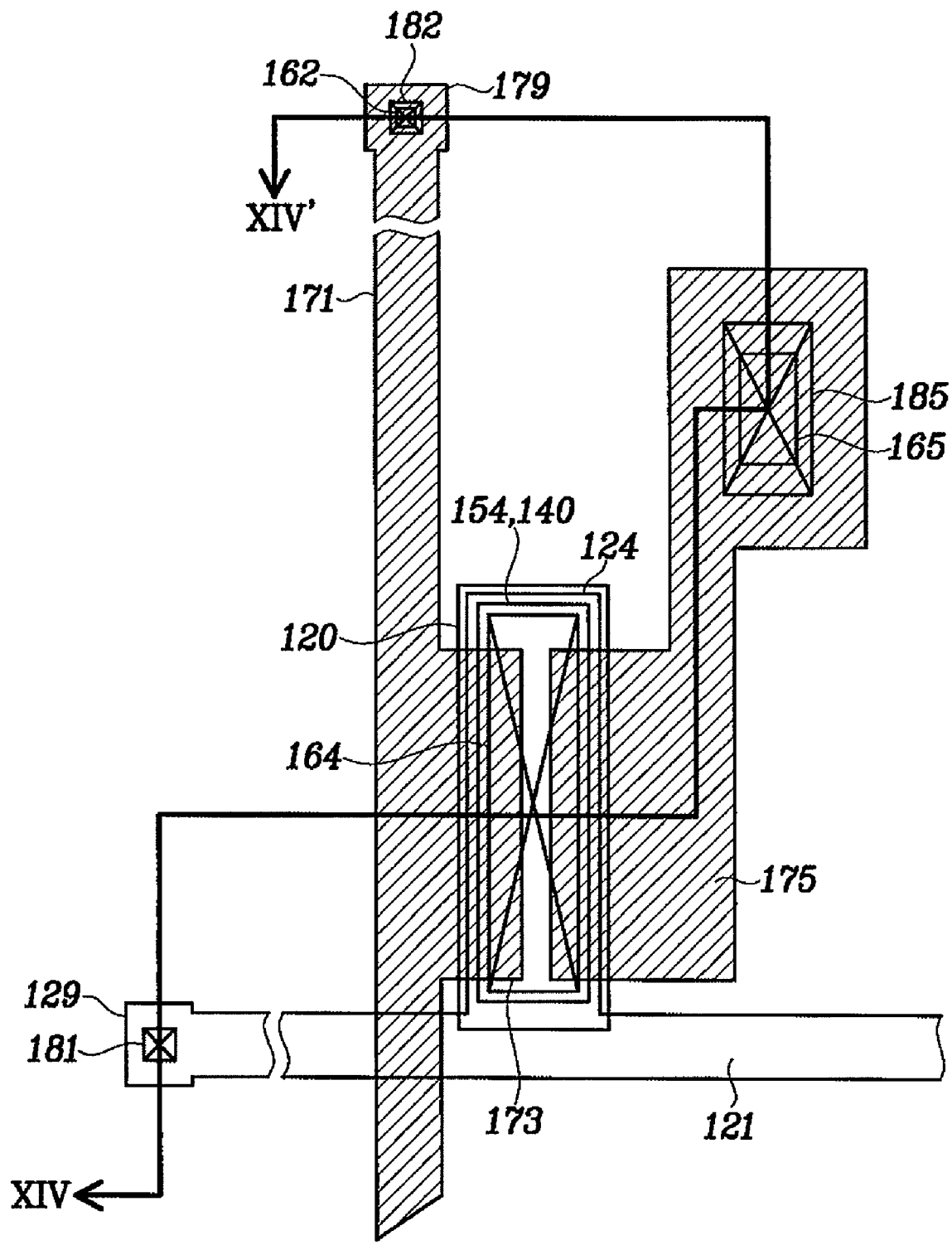
Figure 14:
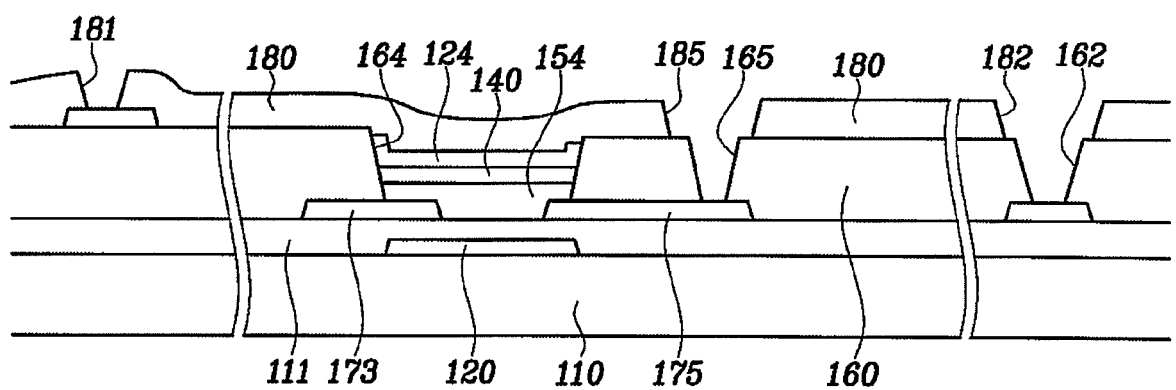
FIG. 14 is a sectional view of the TFT array panel shown in FIG. 13 taken along line XIV-XIV'.

FIG. 3, FIG. 5, FIG. 7, FIG. 9, FIG. 11, and FIG. 13 are layout views of the organic TFT array panel shown FIG. 1 and FIG. 2 in intermediate steps of a manufacturing method thereof according to an embodiment of the present invention, FIG. 4 is a sectional view of the TFT array panel shown in FIG. 3 taken along line IV-IV', FIG. 6 is a sectional view of the TFT array panel shown in FIG. 5 taken along line VI-VI', FIG. 8 is a sectional view of the TFT array panel shown in FIG. 7 taken along line VIII-VIII', FIG. 10 is a sectional view of the TFT array panel shown in FIG. 9 taken along line X-X', FIG. 12 is a sectional view of the TFT array panel shown in FIG. 11 taken along line XII-XII', and FIG. 14 is a sectional view of the TFT array panel shown in FIG. 13 taken along line Referring to FIG. 3 and FIG. 4, a plurality of light blocking islands 120 are formed on an insulating substrate 110 by deposition, lithography, and etch. Thereafter, an insulating layer 111 is coated on the substrate 110.

Referring to FIG. 5 and FIG. 6, a plurality of data lines 171 including source electrodes 173 and end portions 179 and a plurality of drain electrodes 175 are formed on the insulating layer 111 by deposition, lithography, and etch.

Referring to FIG. 7 and FIG. 8, a photosensitive organic film is coated on the insulating layer 111 by means of spin coating, etc., and the organic film is patterned by lithography to form a partition 160 having a plurality of openings 164 disposed on the light blocking islands 120 and a plurality of contact holes 162 and 165 exposing the end portions 179 of the data lines 171 and the drain electrodes 175. According to another embodiment of the present invention, the partition 160 may be omitted.

Referring to FIG. 9 and FIG. 10, organic semiconductor is dropped in the openings 164 of the partition 160 by inkjet printing to form a plurality of organic semiconductor islands 154. The organic semiconductor islands 154 may be formed by deposition such as spin coating, lithography, and etching without the partition 160.

Subsequently, liquid organic insulator is dropped on the organic semiconductor islands 154 in the openings 164 of the partition 160 by inkjet printing to form a plurality of gate insulators 140. The gate insulators 140 may be formed by deposition such as spin coating, lithography, and etching without the partition 160.

Referring to FIG. 11 and FIG. 12, a plurality of gate lines 121 including gate electrodes 124 and end portions 129 are formed on the gate insulators 140 and the partition 160 by deposition, lithography, and etching.

Referring to FIG. 13 and FIG. 14, a passivation layer 180 is deposited and patterned by lithography and etching to form a plurality of contact holes 181, 182 and 185 exposing the end portions 129 of the gate lines 121, the end portions 179 of the data lines 171, and the drain electrodes 175, respectively.

Finally, a plurality of pixel electrodes 190 and a plurality of contact assistants 81 and 82 are formed on the passivation layer 180 by deposition, lithography, and etching as shown in FIG. 1 and FIG. 2.

Now, an organic TFT according to another embodiment of the present invention will be described in detail with reference to FIG. 15 and FIG. 16.

Figure 15:
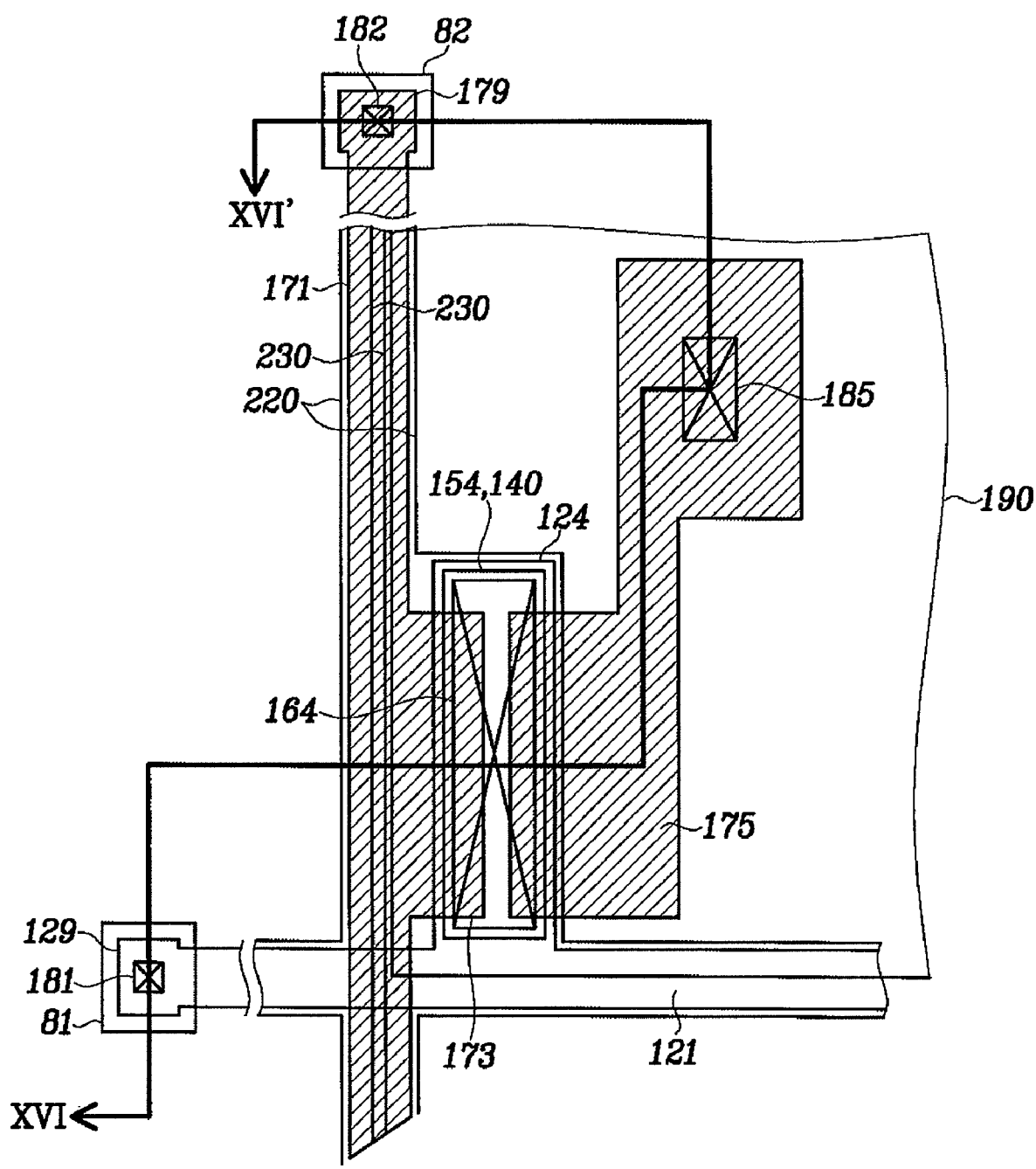
FIG. 15 is a layout view of an organic TFT array panel according to another embodiment of the present invention.
Figure 16:
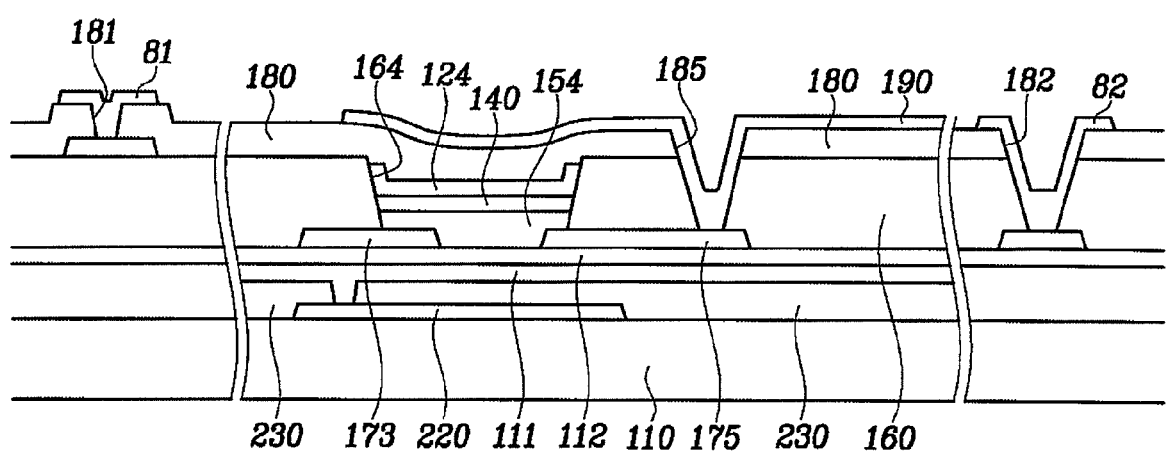
FIG. 16 is a sectional view of the TFT array panel shown in FIG. 15 taken along line XVI-XVI'.

FIG. 15 is a layout view of an organic TFT array panel according to another embodiment of the present invention, and FIG. 16 is a sectional view of the organic TFT array panel shown in FIG. 15 taken along line XVI-XVI'.

As shown in FIG. 15 and FIG. 16, a layered structure of the organic TFT array panel according to this embodiment is almost the same as that shown in FIG. 1 and FIG. 2.

That is, a lower insulating layer 111 is formed on a substrate 110. A plurality of data lines 171 including source electrodes 173 and end portions 179 and a plurality of drain electrodes 175 are formed on the lower insulating layer 111, and a partition 160 having a plurality of openings 164 is formed thereon. A plurality of organic semiconductor islands 154 and a plurality of gate insulators 140 are sequentially formed in the openings 164 of the partition 160, and a plurality of gate lines 121 including gate electrodes 124 and end portions 129 are formed thereon. A passivation layer 180 is formed on the gate lines 121 and the partition 160. The passivation layer 180 has a plurality of contact holes 181 and the passivation layer 180 and the partition 160 have a plurality of contact holes 182 and 185. A plurality of pixel electrodes 190 and a plurality of contact assistants 81 and 82 are formed on the passivation layer 180.

Unlike the organic TFT array panel shown in FIG. 1 and FIG. 2, a light blocking member 220 having a plurality of openings facing the pixel electrodes 190 is substituted for the plurality of light blocking islands 120.

A plurality of color filters 230 are formed on the substrate 110 and in the openings of the light blocking member 220. The color filters 230 may represent primary colors such as red, green, and blue.

Furthermore, an upper insulating layer 112 preferably made of inorganic insulating material such as silicon nitride is formed on the lower insulating layer 111. The upper insulating layer 112 prevents organic impurity in the lower insulating layer 111, which may be made of photosensitive organic material, from being intruded into the organic semiconductor islands 154.

A method of manufacturing the organic TFT array panel shown in FIGS. 15 and 16 according to an embodiment of the present invention is almost the same as that shown in FIG. 3 to FIG. 14.

A light blocking member 220 is formed by depositing and patterning opaque material such as Cr on the insulating substrate 110. Thereafter, deposition and patterning of an insulating film including a color pigment such as red, green, or blue pigment is repeatedly performed for respective colors to form a plurality of color filters 230. Then, remaining elements are formed as shown in FIG. 3 to FIG. 14.

Many of the above-described features of the organic TFT array panel and the manufacturing method thereof shown in FIG. 1 to FIG. 14 may be appropriate to the organic TFT array panel shown in FIG. 15 and FIG. 16 and the manufacturing method thereof.

An organic TFT array panel according to another embodiment of the present invention will be described in detail with reference to FIG. 17 and FIG. 18.

Figure 17:
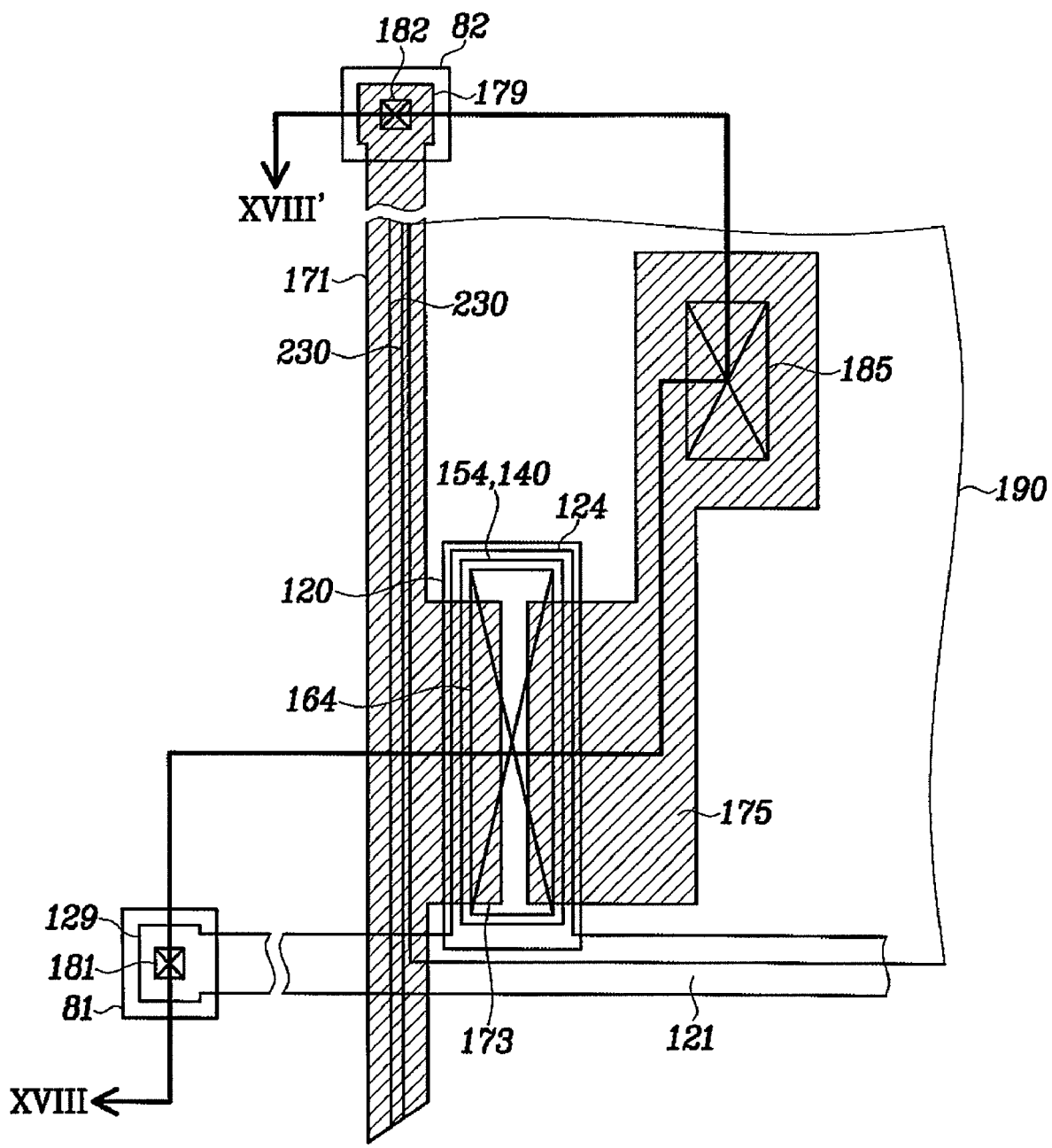
FIG. 17 is a layout view of a TFT array panel according to another embodiment of the present invention.
Figure 18:
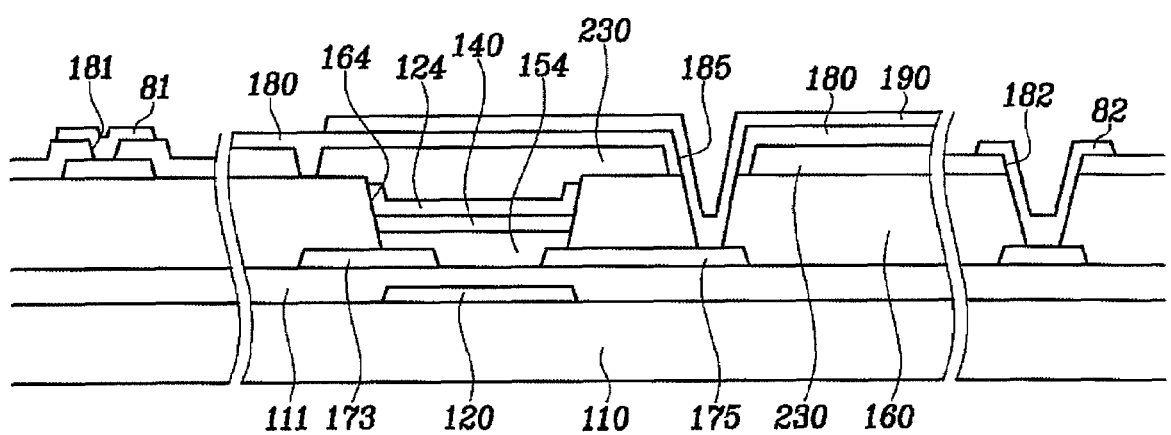
FIG. 18 is a sectional view of the organic TFT array panel shown in FIG. 17 taken along line XVIII-XVIII'.

FIG. 17 is a layout view of an organic TFT array panel according to another embodiment of the present invention, and FIG. 18 is a sectional view of the organic TFT array panel shown in FIG. 17 taken along line XVIII-XVIII'.

As shown in FIG. 17 and FIG. 18, a layered structure of the organic TFT array panel according to this embodiment is almost the same as that shown in FIG. 1 and FIG. 2.

That is, a plurality of light blocking islands 120 are formed on a substrate 110 and an insulating layer 111 is formed thereon. A plurality of data lines 171 including source electrodes 173 and end portions 179 and a plurality of drain electrodes 175 are formed on the insulating layer 111, and a partition 160 having a plurality of openings 164 is formed thereon. A plurality of organic semiconductor islands 154 and a plurality of gate conductors 140 are sequentially formed in the openings 164 of the partition 160, and a plurality of gate lines 121 including gate electrodes 124 and end portions 129 are formed thereon. A passivation layer 180 is formed on the gate lines 121 and the partition 160. The passivation layer 180 has a plurality of contact holes 182 and the passivation layer 180 and the partition 160 have a plurality of contact holes 182 and 185. A plurality of pixel electrodes 190 and a plurality of contact assistants 81 and 82 are formed on the passivation layer 180.

Unlike the organic TFT array panel shown in FIG. 1 and FIG. 2, a plurality of color filters 230 are formed on the partition 160 and the gate lines 121. The color filters 230 have a plurality of openings exposing lower portions of the contact holes 185 defined by the partition 160 and there is no color filter 230 in peripheral areas where the end portions 129 of the gate lines 121 and the end portions 179 of the data lines 171 are disposed. The color filters 230 may overlap each other on the data lines 171 to block light leakage between the pixel electrodes 190.

Many of the above-described features of the organic TFT array panel and the manufacturing method thereof shown in FIG. 1 to FIG. 14 may be appropriate to the organic TFT array panel shown in FIG. 17 and FIG. 18 and the manufacturing method thereof.

In the above-described embodiments of the present invention, the light blocking islands 120 or the light blocking member 220 is disposed under the organic semiconductor islands 154 and the gate electrodes 124 are disposed on the organic semiconductor islands 154 such that the light incident on the organic semiconductor islands 154 is substantially fully blocked by the light blocking islands 120, the light blocking member 220, and the gate electrodes 124, thereby securing stable characteristics of the organic TFTs. In addition, the organic semiconductor islands 154 are defined by the partition 160 such that the manufacturing process can be simplified. Furthermore, since the partition, the insulating layer, and the passivation layer, which can be made of organic material, can be formed by lithography without etch, the manufacturing process can be simplified.

Although preferred embodiments of the present invention have been described in detail hereinabove, it should be clearly understood that many variations and/or modifications of the basic inventive concepts herein taught which may appear to those skilled in the present art will still fall within the spirit and scope of the present invention, as defined in the appended claims.

What is claimed is:

1. A method for manufacturing an organic thin film transistor array panel, the method comprising:
    forming a light blocking member, which is a black matrix, directly on a substrate;
    forming a first insulating layer on the light blocking member after forming the light blocking member;
    forming a data line and a drain electrode on the first insulating layer after forming the first insulating layer on the light blocking member, the data line including a source electrode;
    forming a partition having an opening partly exposing the source electrode and the drain electrode and a contact hole exposing the drain electrode;
    forming a semiconductor in the opening, the semiconductor being in alignment with the light blocking member;
    forming a gate insulator on the semiconductor;
    forming a gate line including a gate electrode on the gate insulator;
    forming a passivation layer on the gate line; and
    forming a pixel electrode on the passivation layer.

2. The method of claim 1, wherein the formation of the semiconductor comprises inkjet printing.

3. The method of claim 1, wherein the formation of the gate insulator comprises inkjet printing.

4. The method of claim 1, wherein the partition comprises organic insulating material.

5. The method of claim 1, further comprising:
    forming a second insulating layer on the first insulating layer, the first insulating layer being an organic insulating material and the second insulating layer being an inorganic insulating material.

6. The method of claim 1, further comprising:
    forming a color filter under the data line and the drain electrode.

7. The method of claim 1, further comprising:
    forming a color filter under the passivation layer.

8. The method of claim 1, wherein the semiconductor is an organic semiconductor.

9. The method of claim 1, wherein the gate electrode fully covers the gate insulator.

10. The method of claim 9, wherein a portion of the gate electrode is disposed on the partition and overlaps a portion of the partition.

11. A method for manufacturing an organic thin film transistor array panel, the method comprising:
    forming a light blocking member on a substrate;
    forming a first insulating layer on the light blocking member;
    forming a data line and a drain electrode on the first insulating layer, the data line including a source electrode;
    forming a partition having an opening partly exposing the source electrode and the drain electrode;
    forming a semiconductor in the opening;

forming a gate insulator on the semiconductor to be confined in the opening;
forming a gate line including a gate electrode on the gate insulator;
forming a passivation layer on the gate line; and
forming a pixel electrode on the passivation layer.

12. The method of claim 11, wherein the semiconductor is an organic semiconductor.

13. The method of claim 11, wherein the gate electrode fully covers the gate insulator.

14. The method of claim 13, wherein a portion of the gate electrode is disposed on the partition and overlaps a portion of the partition.

* * * * *